United States Patent
Wuu et al.

[11] Patent Number: 6,040,227
[45] Date of Patent: Mar. 21, 2000

[54] IPO DEPOSITED WITH LOW PRESSURE $O_3$-TEOS FOR PLANARIZATION IN MULTI-POLY MEMORY TECHNOLOGY

[75] Inventors: Shou-Gwo Wuu, Hsinchu; Lung Chen, Hsin-Chu; Dun-Nian Yaung; Yi-Miaw Lin, both of Taipei, all of Taiwan

[73] Assignee: Taiwan Semiconductor Manufacturing Company, Hsin-Chu, Taiwan

[21] Appl. No.: 09/086,826

[22] Filed: May 29, 1998

[51] Int. Cl.[7] .............................................. H01L 21/8244
[52] U.S. Cl. .......................................... 438/382; 438/384
[58] Field of Search .................................... 438/382, 384

[56] References Cited

U.S. PATENT DOCUMENTS

| | | | |
|---|---|---|---|
| 4,872,947 | 10/1989 | Wang | 156/643 |
| 5,290,727 | 3/1994 | Jain | 437/52 |
| 5,554,558 | 9/1996 | Hsu et al. | 437/60 |
| 5,587,696 | 12/1996 | Su et al. | 338/314 |
| 5,602,049 | 2/1997 | Wen et al. | 437/52 |
| 5,605,859 | 2/1997 | Lee | 437/60 |
| 5,618,749 | 4/1997 | Takahashi | 438/384 |
| 5,624,864 | 4/1997 | Arita et al. | 437/3 |
| 5,631,188 | 5/1997 | Chang et al. | 438/253 |
| 5,652,174 | 7/1997 | Wuu et al. | 437/60 |
| 5,943,582 | 8/1999 | Huang | 438/396 |

*Primary Examiner*—Chandra Chaudhari
*Assistant Examiner*—Matthew Whipple
*Attorney, Agent, or Firm*—George O. Saile; Stephen B. Ackerman; William J. Stoffel

[57] ABSTRACT

The present invention provides a method of inter-poly oxide (IPO) layer underlying a polysilicon resistor in a memory product. The IPO layer 15 is formed by a modified low pressure SACVD-$O_3$-TEOS process that gives the IPO layer a smoother surface and good planarization. This IPO layer gives the overlying polysilicon resistors a more uniform resistance. The method begins by providing a semiconductor structure 10. Next, in an important step, an inter-poly oxide (IPO) layer 11 is formed using low pressure ozone assisted sub-atmospheric chemical vapor deposition (SACVD $O_3$-TEOS) process at a pressure between about 20 and 150 torr. A polysilicon resistor 15 is then formed on said inter-poly oxide (IPO) layer. The memory device is completed by forming passivation and conductive layers thereover.

9 Claims, 2 Drawing Sheets

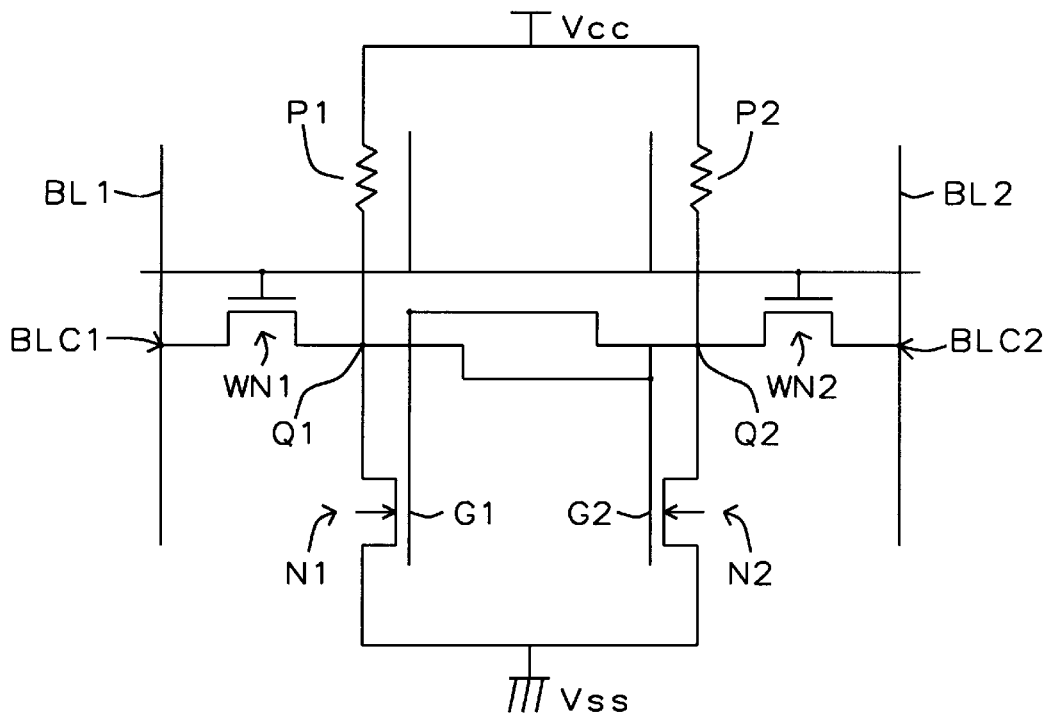
FIG. 1 – Prior Art
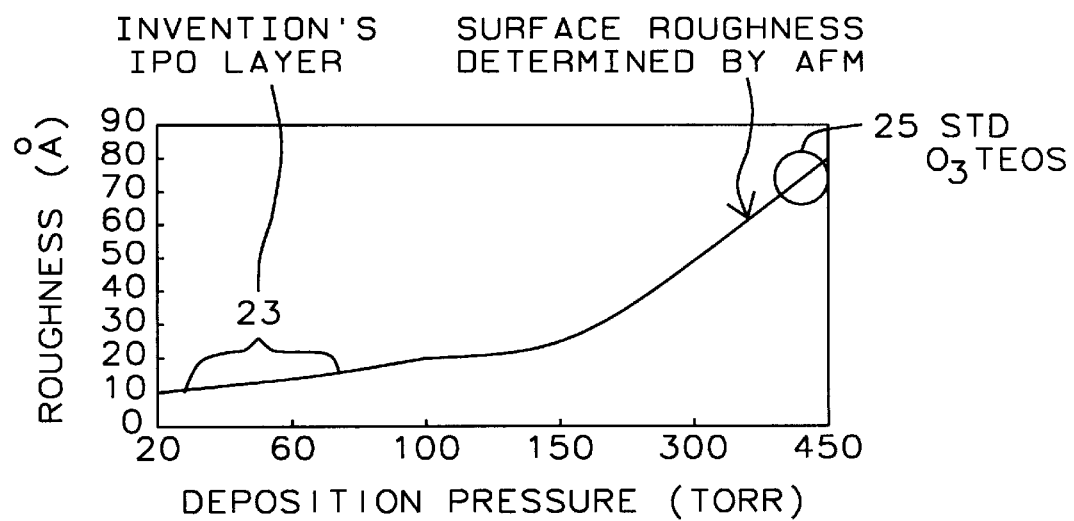
FIG. 2

ID DEPOSITED WITH LOW PRESSURE $O_3$-TEOS FOR PLANARIZATION IN MULTI-POLY MEMORY TECHNOLOGY

1) FIELD OF THE INVENTION

This invention relates generally to the fabrication of a dielectric layer and a resistor for a semiconductor device and more preferably a method for forming an inter-poly oxide (IPO) layer using a $O_3$-SACVD process under a polysilicon resistor for a memory device.

2) DESCRIPTION OF THE PRIOR ART

Inter-poly oxide (IPO) layer planarization is a critical process in semiconductor manufacturing and more particularly in memory devices, especially SRAM products. The rough topology of underlying devices reduces photo depth of focus (DOF) and induces etch residues.

A circuit schematic for a typical polysilicon load resistor SRAM cell, commonly referred to as poly-load SRAM is shown in FIG. 1. Only one of the cells in the array of cell is shown in FIG. 1. The SRAM circuit is fabricated using polysilicon resistors that are doped with an N-type conductive dopant of the load resistors, labeled P1 and P2 in FIG. 1. Two N-channel FETs formed in and on the substrate are used for the drive transistors, labeled N1 and $N_2$ and two N-channel FETs, formed at the same time, are also used as the pass transistors, and labeled WN1 and WN2 in FIG. 1.

The inventor has found that current inter-poly oxide (IPO) layers that are formed under polysilicon load resistors have several problems. As shown in U.S. Pat. No. 5,652,174 (Wuu et al) assigned to the same company, a LPCVD TEOS oxide layer is often formed under load resistors. First, a problem with current dielectric layers (IPO) under resistors is that the underlying topology is very rugged and uneven. The LPCVD TEOS layer is a conformal layers that replicates the rough topology. This uneven topology under the poly resistor causes poly Load resistor (Rs) fluctuations. Moreover the IPO layer have a rough surface.

The importance of overcoming the various deficiencies noted above is evidenced by the extensive technological development related to the subject, as documented by the relevant patent and technical literature. The closest and apparently more relevant technical developments in the patent literature can be gleaned by considering U.S. Pat. No. 5,624,864 (Arita) shows a method of forming a capacitor over a (e.g., PSG) dielectric layer. U.S. Pat. No. 5,554,558 (Hsu) shows a TEOS capacitor dielectric layer (See col. 3, lines 25–35). U.S. Pat. No. 5,631,188 (Chang) show other methods of forming polysilicon capacitors. US 5,605,859 (Lee), U.S. Pat. No. 5,587,696(Su), U.S. Pat. No. 5,602,049 (Wen) and U.S. Pat. No. 5,652,174 (Wuu et al) show various IPO layers.

SUMMARY OF THE INVENTION

It is an object of the present invention to provide a method for fabricating a inter-poly oxide (IPO) layer under a polysilicon resistor for a memory device It is an object of the present invention to provide a method for fabricating a inter-poly oxide (IPO) layer using a low pressure $O_3$-TEOS process under a polysilicon resistor that improves resistor performance.

It is an object of the present invention to provide a method for fabricating a inter-poly oxide (IPO) layer under a polysilicon resistor for a memory device that planarizes (levels) the IPO layer surface to obtain more uniform polysilicon resistor resistance.

It is an object of the present invention to provide a method for fabricating a inter-poly oxide (IPO) layer under a polysilicon resistor for a SRAM memory device.

It is an object of the present invention to provide a method for fabricating a inter-poly oxide (IPO) layer under a polysilicon resistor using a $O_3$-SACVD TEOS process that forms a smooth IPO layer and uniform resistor resistance.

To accomplish the above objectives, the present invention provides a method of fabrication an inter-poly oxide (IPO) layer under a polysilicon resistor comprising a) See FIG. 1—providing a semiconductor structure 10;

b) forming a inter-poly oxide (IPO) layer 11 over the semiconductor structure using ozone assisted sub-atmospheric chemical vapor deposition (SACVD $O_3$-TEOS) process at a pressure in a range of between about 20 and 150 torr;

c) forming a polysilicon resistor 15 on the inter-poly oxide (IPO) layer.

In a preferred embodiment, the IPO layer of the invention is formed in a memory device in a method comprising:

a) See FIG. 4—providing a semiconductor substrate 100 having at least an isolations area 112 and an active area;

b) depositing a first polysilicon layer 118A 118B and a first insulating layer 122 over the substrate surface;

c) patterning the first polysilicon layer 118A 118B and the first insulating layer 122 to form a conductive line 118A over the isolation region and a gate electrode 18B and a top gate insulating layer 112 over the active area;

d) forming insulating sidewall spacers 126 on the gate electrode 118B;

e) forming doped regions 114 adjacent to the gate electrode 118; the doped regions serving as source and drain regions;

f) forming a first inter-poly oxide (IPO) layer 132 over conductive line and the gate electrode and elsewhere over the substrate surface;

g) forming a second IPO layer 134 over the first inter-poly oxide (IPO) layer 132; the second IPO layer 134 formed using ozone assisted sub-atmospheric chemical vapor deposition (SACVD $O_3$-TEOS) process at a pressure in a range of between about 20 and 150 torr;

h) patterning the first and second IPO layers 132 134 to expose portions of the conductive line 118A and the doped region 114, i) forming a polysilicon layer 140 over the second inter-poly oxide (IPO) layer and contacting the doped region; and j) patterning the polysilicon layer 140 to form a resistor 140 whereby the second inter-poly oxide (IPO) layer 134 ensures that the resistor has a uniform resistance.

The invention's Low pressure SACVD $O_3$-TEOS process forms a IPO layer that is substantially smoother than conventional LPCVD TEOS layers. The invention's Low pressure SACVD $O_3$-TEOS process provides a smoother IPO surface because the invention's SACVD $O_3$ TEOS layer better smooth (planarizes) the surface. The invention's IPO layer with it's smooth surface provides lower resistance and more uniform Poly load resistors. The resistors more uniform resistance form the smoother IPO layer is caused by better surface planarization.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 is an electrical schematic of a conventional prior art circuit of a four transistor /load resistor SRAM cell.

FIG. 2 is a graph showing the IPO layer's (of the invention) surface roughness as a function of deposition pressure as measured by AFM.

DETAILED DESCRIPTION OF THE PREFERRED EMBODIMENTS

The present invention will be described in detail with reference to the accompanying drawings. The present invention provides a method of forming a In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well know process have not be described in detail in order to not unnecessarily obscure the present invention.

It should be recognized that many publications describe the details of common techniques used in the fabrication process of integrate circuit component. See, E.g, C. Y. Chang, S. M. Sze, in *ULSI Technology,* by The McGraw-Hill Company, Inc. copyright 1997. Those techniques can be generally employed in the fabrication of the structure of the present invention. Moreover, the individual steps of such a process can been performed using commercially available integrated circuit fabrication machines. As specifically necessary to than understanding of the present invention, exemplary technical data are set forth based upon current technology, Future developments in the art may call for appropriate adjustments as would be obvious to one skilled in the art.

General Process Description

Figure 3:
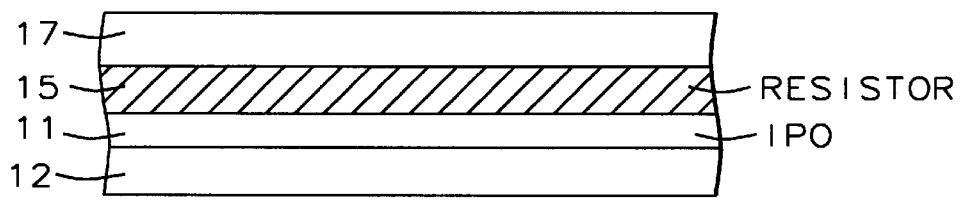
FIG. 3 is a cross sectional view for illustrating a method for manufacturing an IPO layer in an SRAM having a polysilicon resistor according to the present invention.

The method of the invention for fabricating an inter-poly oxide (IPO) layer under a polysilicon resistor begins as shown in FIG. 3.

A semiconductor structure 12 is provided. Semiconductor structure 12 is understood to possibly include a semiconductor wafer, active and passive devices formed within the wafer and layers formed on the wafer surface. The semiconductor structure 12 preferably comprises conductive and insulating layers over a semiconductor substrate. The semiconductor structure 12 preferably comprised devices that make up a memory device, such as transistor for a SRAM or other memory devices. Preferably, in a semiconductor substrate are formed source and drain regions. Next a gate structure is formed. Next a conductive polysilicon layer is formed and patterned to form transistors.

Next, as shown in FIG. 3, an inter-poly oxide (IPO) layer 11 is formed over the semiconductor structure 12 using the invention's low pressure ozone assisted sub-atmospheric chemical vapor deposition (SACVD $O_3$-TEOS) process. The IPO layer is preferably a planarization layer. The IPO layer 15 is preferably deposited at a pressure in a range of between about 20 and 50 torr and more preferably between about 20 and 100 torr. The preferred process for the inter-poly oxide (IPO) layer (SACVD $O_3$-TEOS) is shown below in the table.

TABLE

Preferred process for the inter-poly oxide (IPO) layer (SACVD $O_3$-TEOS)

| parameter | units | Low limit | High limit |
|---|---|---|---|
| Temperature | C | 300 | 800 |
| Pressure | torr | 20 | 150 |
| $O_3$ to TEOS ratio | 6:1 | 20:1 | |
| deposition rate | Å/min | 1500 | 3000 |
| RF Power | | | |
| IPO layer roughness - | By AFM (Å) | 0 | 50 |
| inter-poly oxide (IPO) layer thickness | Å | 500 | 10,000 |

A preferred TEOS reactor is the AMAT P5000 L Centura reactor by Applied Materials corporation.

The invention's low pressure $O_3$-TEOS IPO layer is formed with a thickness of about 5,00 to 10,000 ANG., utilizing the CVD method under conditions of: (i) a mass flow rate of the TEOS being about 1 to 2 l/min; (ii) a mass flow rate of an oxygen containing an ozone (O3) being about 5 to 10 l/min; (iii) a concentration of the $O_3$ being about 75–130 g/m3 (iv) a substrate temperature being about 350° to 450° C.; and (v) a pressure being about 20 TO 150 Torr—Sub-Atmospheric pressure.

The invention's $O_3$ -TEOS process with it's lower pressure range makes the IPO layer 11 surface smoother. The inventor theorizes that at the lower pressure that the recombination of the pre-cursor of $O_3$ and TEOS reaction is reduced therefore creating a smoother surface.

FIG. 2 shows the relationship between the IPO layer smoothness and deposition pressure for $O_3$-SACVD IPO layers measured by AFM (Atomic Force measurement). The IPO layer used in the analysis in FIG. 2 was formed under the following conditions:

| parameter | units | Low limit | High limit |
|---|---|---|---|
| Temperature | C | 300 | 800 |
| Pressure | torr | varied by sample | varied by sample |
| $O_3$ to TEOS ratio | 6:1 | 20:1 | |
| deposition rate | Å/min | 1500 | 3000 |
| RF Power | | | |
| IPO layer roughness - | By AFM (Å) | 0 | 50 |

-continued

| parameter | units | Low limit | High limit |
|---|---|---|---|
| inter-poly oxide (IPO) layer thickness | Å | 500 | 10,000 |

FIG. 2 shows the optimum pressure range to be between 20 and 150 torr.

As a comparison, the inventor's standard $O_3$ TEOS layer has a surface roughness (measured by the AFM) is between about 80 to 100 Å. This is about 400% rougher than the invention's low pressure $O_3$-TEOS IPO layer. It is important to note that SACVD TEOS layers are used in the industry for back end processes, but not used for IPO layers because of their high surface sensitivity. This surface sensitivity causes resistance fluctuations. Moreover, the conventional SACVD oxide changes the value of the resistors compared to resistors formed over LPTEOS IPO layers (which are commonly used). In addition, Standard SACVD layers have moisture absorption problems that are eliminated with the invention's process.

Next, a polysilicon resistor 15 is formed on the inter-poly oxide (IPO) layer. The polysilicon resistor can be formed of a polysilicon layer deposited by a LPCVD process using for example silane ($SiH_4$) and is doped using a ion implantation or alternately by in situ doped with As or P. The dopant concentration is preferably between about 1E13 and 1E15 atoms/cm$^3$ and more preferably between about 9E13 and 2E14 atoms/cm$^3$. The polysilicon layer preferably has a thickness between about 500 and 1000 Å. The polysilicon layer can be patterned using convention photolithographic techniques and anisotropic plasma etching to formed polysilicon load resistors, connective wiring, and contacts for the device being formed.

As shown in FIG. 3, an insulating layer 17 is preferably formed over the resistor 15. The insulating layer is can be formed of an oxide.

The method further includes forming conductive and passivation layers over the polysilicon resistor 15 and insulating layer 17 to form a memory device such as a SRAM, DRAM, FET integrated circuits.

Figure 4:
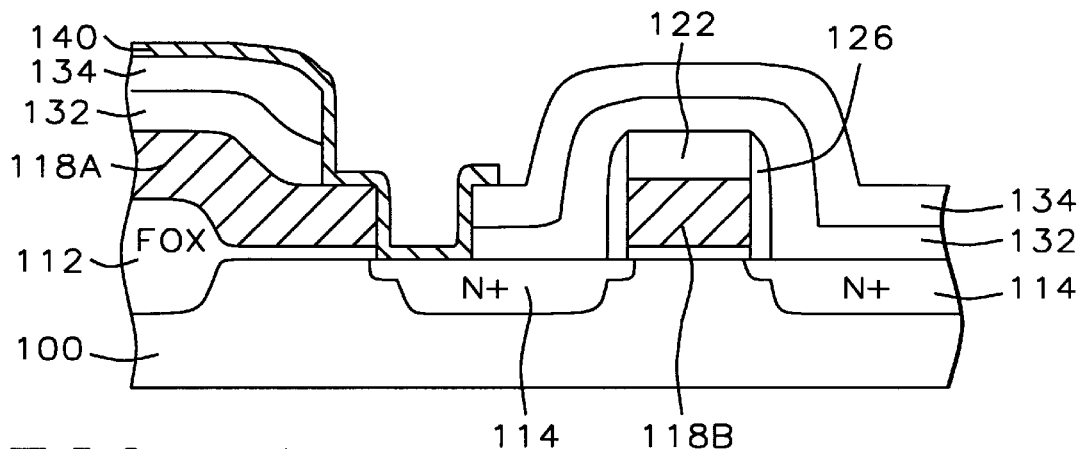
FIG. 4 is a cross sectional view for illustrating a method for manufacturing an IPO layer 134 in an SRAM having a polysilicon resistor 140 according to the present invention.

Example 1 of Invention's IPO layer in SRAM-FIG. 4

FIG. 4 shows an example (preferred embodiment) of an SRAM having an inter-poly oxide (IPO) that is formed using the invention's low pressure $O_3$-SACVD TEOS process. FIG. 4 shows a semiconductor substrate 100 having at least an isolations area 112 and an active area. Next, a first polysilicon layer 118A 118B and a first insulating layer 122 are deposited over the substrate surface. The first polysilicon layer 118A 118B and the first insulating layer 122 are patterned to form a conductive line 118A over the isolation region and a gate electrode 18B and a top gate insulating layer 112 over the active area. Next, insulating sidewall spacers 126 are formed on the gate electrode 118B. Then doped regions 114 are formed adjacent to the gate electrode 118. The doped regions serve as source and drain regions. A first inter-poly oxide (IPO) layer 132 is formed over conductive line and the gate electrode and elsewhere over the substrate surface.

In an important step a second IPO layer 134 is formed over the first inter-poly oxide (IPO) layer 132. The second IPO layer 134 is formed using the invention's ozone assisted sub-atmospheric chemical vapor deposition (SACVD $O_3$-TEOS) process at a pressure in a range of between about 20 and 150 torr.

The first and second IPO layers 132 134 are then patterned to expose portions of the conductive line 118A and the doped region 114. A polysilicon layer 140 is formed over the second inter-poly oxide (IPO) layer and contacting the doped region. The polysilicon layer 140 is patterned to form a resistor whereby the second inter-poly oxide (IPO) layer 134 ensures that the resistor has a uniform resistance.

Figure 5:
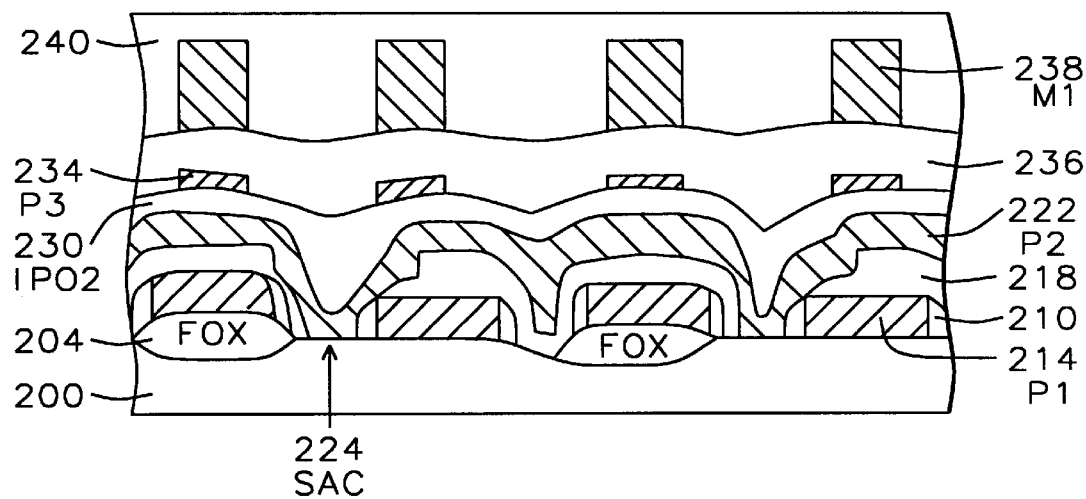
FIG. 5 is a cross sectional view for illustrating a method for manufacturing an IPO layer 230 in an another SRAM having a polysilicon resistor 234 according to the present invention

Example 2—IPO-2 layer in SRAM-FIG. 5

FIG. 5 shows another example (preferred embodiment) of an SRAM having an inter-poly oxide (IPO-2) 230 that is formed using the invention's low pressure $O_3$-SACVD TEOS process. FIG. 5 shows a semiconductor substrate 200 having at least an isolations area 204 and an active area. Next, a first polysilicon layer 214 (P1) is deposited over the substrate surface. The first polysilicon layer is patterned to form a conductive line over the isolation region and a gate electrode over the active area. Next, insulating sidewall spacers 210 are formed on the gate electrode and conductive lines. Then doped regions (not shown) are formed adjacent to the gate electrode. The doped regions serving as source and drain regions. A first inter-poly oxide (IPO) layer 218 is formed over conductive line and the gate electrode and elsewhere over the substrate surface. The IPO layer (LPCVD TEOS oxide) can be formed by depositing silicon oxide at a temperature between 600 and 800° C. using LPCVD and a TEOS gas. Next, contact openings are formed for the self aligned contact 224 (SAC) for the second poly layer 222 (P2). A second poly layer is then formed over the resultant surface and forms the SAC 224.

In an important step, a second IPO layer 230 (IPO-2) is formed over the second poly layer 218 and over the first inter-poly oxide (IPO) layer 230 in other areas. (not shown). The second IPO layer 218 is formed using the invention's ozone assisted sub-atmospheric chemical vapor deposition (SACVD $O_3$-TEOS) process at a pressure in a range of between about 20 and 150 torr.

Afterwards a third poly layer 234 (P3) is formed and acts as resistors for the memory device. An interlevel dielectric (ILD) layer 236 is formed thereover. Next, a first metal layer 238 (M1) is formed and covered by an inter metal dielectric layer 240. Processing continues as additional conductive and insulating layers are formed to complete the memory device. In the description above some steps are omitted for simplicity. For example, a gate oxide layer is not shown.

Example 3 of the Invention's IPO layer

Another example of a SRAM that can be formed using the invention's invention's $O_3$-SACVD IPO layer is shown in U.S. Pat. No. 5,652,1 74(Wuu et al) to the same assignee which is hereby incorporated by reference into this patent. In Wuu, FIG. 6, the IPO layer 30 can be formed using the invention's $O_3$-SACVD IPO layer. In Wuu in col. 7, line 7 to 10, Wuu teaches a conventional LPCVD TEOS IPO layer. In contrast, Wuu's layer 30 is advantageously formed using the inventor's Low pressure $O_3$-TEOS SACVD IPO process as described above.

Benefits of the Invention's IPO Layer

The SACVD $O_3$-TEOS IPO layer of the present invention controls the resistivity of the overlying polysilicon resistor by making the surface of the IPO layer smoother and more planar. The invention's smoother IPO surface makes the load resistor resistance (load_RS) more uniform. In a SRAM cell, there are two poly—load resistors. Generally, these two polysilicon resistors are formed upon different topography because of the unsymmetrical layout. This will cause different load length and the different resistance. It is important to note that SACVD TEOS layers are used in the industry for back end processes, but not used for IPO layers because of their high surface sensitivity. This surface sensitivity causes resistance fluctuations. Moreover, the conventional SACVD oxide changes the value of the resistors compared to resistors formed over LPTEOS IPO layers (which are commonly used). In addition, Standard SACVD layers have moisture absorption problems that are eliminated with the invention's process.

It should be will understood by one skilled in the art that by including additional process step not described in this embodiment, other types of devices can also be included on the SRAM chip in the examples. For example, P wells in the P substrate and CMOS circuit can be formed therefrom. It should also be understood that the figures depict only one SRAM cell out of a multitude of cells that are fabricated simultaneously on the substrate. Also, the resistors and IPO layer of the invention can be used in other chip types in addition to SRAM chips, such as other memory chip such as embedded SRAM, embedded DRAM, DRAM, bipolar integrated circuits, and FET integrated circuits.

While the invention has been particularly shown and described with reference to the preferred embodiments thereof, it will be understood by those skilled in the art that various changes in form and details may be made without departing from the spirit and scope of the invention.

What is claimed is:

1. A method of fabrication an inter-poly oxide (IPO) layer under a polysilicon resistor comprising:
   a) providing a semiconductor structure,
   b) forming an inter-poly oxide (IPO) layer over said semiconductor structure;
   said inter-poly oxide (IPO) layer formed using an ozone assisted TEOS sub-atmospheric chemical vapor deposition (SACVD $O_3$-TEOS) process at a pressure in a range of between about 20 and 150 torr; and
   c) forming a polysilicon resistor on said inter-poly oxide (IPO) layer.

2. The method of claim 1 which further includes forming conductive and passivation layers over said polysilicon resistor to form a device selected from the group consisting of embedded SRAM, embedded DRAM, dynamic random access memory (DRAM), and static random access memory (SRAM) device.

3. The method of claim 1 wherein said polysilicon resistor is formed of a polysilicon layer deposited by a LPCVD process using for example silane ($SiH_4$) and is doped using a ion implantation or alternately by in situ doped with As or P, the dopant concentration is between about 1E13 and 1E15 atoms/$cm^3$; said polysilicon layer preferably has a thickness between about 500 and 1000 Å.

4. The method of claim I wherein said inter-poly oxide (IPO) layer has a thickness of 500 and 10,000 ANG., utilizing a sub atmospheric chemical vapor deposition (SACVD) $O_3$-TEOS method under conditions of: (i) a mass flow rate of the TEOS being about 1 to 2 l/min; (ii) a mass flow rate of an oxygen containing an ozone (03) being about 5 to 10 l/min; (iii) a concentration of the $O_3$ being about 75 to 130 g/$m^3$; (iv) a substrate temperature being 350° to 450° C.; and (v) a pressure being 20 to 100 Torr-sub Atmospheric pressure.

5. The method of claim 1 wherein said inter-poly oxide (IPO) layer has a thickness of between 500 and 10,000 .ANG., and is formed utilizing a $O_3$-TEOS SACVD method under conditions of a Temperature in a range of between about 300 and 800° C., a Pressure in a range of between about 20 and 150 torr, $O_3$ to TEOS ratio between about 6:1 and 20:1, a deposition rate in a range of between about 1500 and 3000 Å/min; said inter-poly oxide (IPO) layer has a roughness between about 0 and 50 Å measured by AFM.

6. A method of fabrication an inter-poly oxide (IPO) layer under a polysilicon resistor comprising:
   a) providing a semiconductor structure;
   b) forming an inter-poly oxide (IPO) layer over said semiconductor structure using an ozone assisted sub-atmospheric chemical vapor deposition (SACVD $O_3$-TEOS) process at the following conditions: at a pressure in a range of between about 20 and 100 torr, a Temperature in a range of between about 300 and 800° C., a pressure in a range of between about 20 and 150 torr, $O_3$ to TEOS ratio between about 6:1 and 20:1, a deposition rate in a range of between about 1500 and 3000 Å/min, a inter-poly oxide (IPO) layer roughness between about 0 and 50 Å measured by AFM and said inter-poly oxide (IPO) layer has a thickness between about 500 and 10,000 ANG., and
   c) forming a polysilicon resistor on said inter-poly oxide (IPO) layer.

7. The method of claim 6 wherein said polysilicon resistor is formed of a polysilicon layer deposited by a LPCVD process using silane ($SiH_4$) and has a dopant concentration between about 1E13 and 1E15 atoms/$cm^3$, said polysilicon layer has a thickness between about 500 and 1000 Å.

8. A method of fabrication a memory device with an inter-poly oxide (IPO) layer under a polysilicon resistor comprising:
   a) providing a semiconductor substrate having at least an isolations area and an active area;
   b) depositing a first polysilicon layer and a first insulating layer over said substrate surface;
   c) patterning said first polysilicon layer and a first insulating layer to form a gate electrode and a top gate insulating layer over said active area, and form a conductive line over said isolation region;
   d) forming insulating sidewall spacers on said gate electrode;
   e) forming doped regions adjacent to said gate electrode; said doped regions serving as source and drain regions;
   f) forming a first inter-poly oxide (IPO) layer over conductive line and said gate electrode and elsewhere over the substrate surface;
   g) forming a second IPO layer over said first inter-poly oxide (IPO) layer; the second IPO layer formed using ozone assisted sub-atmospheric chemical vapor deposition (SACVD $O_3$-TEOS) process at a pressure in a range of between about 20 and 150 torr;
   h) patterning said first and second IPO layers to expose portions of said conductive line and said doped region;
   i) forming a polysilicon layer over said second inter-poly oxide (IPO) layer and contacting said doped region; and j) patterning said polysilicon layer to form a resistor whereby said second inter-poly oxide (IPO) layer ensures that the resistor has a uniform resistance.

9. The method of claim 8 wherein said second inter-poly oxide (IPO) layer has a thickness of between 500 and 10,000 .ANG., and is formed utilizing a $O_3$-SACVD TEOS method under conditions of a Temperature in a range of between about 300 and 800° C., a Pressure in a range of between about 20 and 150 torr, $O_3$ to TEOS ratio between about 6:1 and 20:1, a deposition rate in a range of between about 1500 and 3000 Å/min, said inter-poly oxide (IPO) layer has a roughness between about 0 and 50 Å measured by AFM.

\* \* \* \* \*